United States Patent [19]

Hatanaka et al.

[11] Patent Number: 4,788,445
[45] Date of Patent: Nov. 29, 1988

[54] LONG ARRAY PHOTOELECTRIC CONVERTING APPARATUS WITH INSULATED MATRIX WIRING

[75] Inventors: Katsunori Hatanaka; Yoshinori Isobe, both of Yokohama; Toshihiro Saika, Hiratsuka; Katsumi Nakagawa, Kawasaki, all of Japan

[73] Assignee: Canon Kabushiki Kaisha, Tokyo, Japan

[21] Appl. No.: 5,767

[22] Filed: Jan. 21, 1987

[30] Foreign Application Priority Data

Jan. 24, 1986 [JP] Japan ................................ 61-11987
Jan. 24, 1986 [JP] Japan ................................ 61-11988

[51] Int. Cl.⁴ ....................... H01J 40/14; H01L 27/14
[52] U.S. Cl. ...................................... 250/578; 357/30
[58] Field of Search ................ 250/578; 357/24, 30 H

[56] References Cited

U.S. PATENT DOCUMENTS

| | | | |
|---|---|---|---|
| 3,983,573 | 9/1976 | Ishihara | 250/578 |
| 3,988,613 | 10/1976 | Brown et al. | 357/30 H |
| 4,012,587 | 3/1977 | Ochi et al. | 250/578 |
| 4,288,702 | 9/1981 | Ozawa et al. | 250/578 |
| 4,571,624 | 2/1986 | Nishizawa et al. | 357/24 |
| 4,603,342 | 7/1986 | Savoye et al. | 357/30 H |

*Primary Examiner*—David C. Nelms
*Assistant Examiner*—William L. Oen
*Attorney, Agent, or Firm*—Fitzpatrick, Cella Harper & Scinto

[57] ABSTRACT

There is a photoelectric converting apparatus in which (N×M) photoelectric converting elements arranged in a one-dimensional array form are connected to N voltage applying electrodes and M signal readout electrodes in a matrix form. In this apparatus, the wiring crossing portions of the matrix connection are provided on the side of the voltage applying electrodes, and the insulation of the wiring crossing portion is formed as the laminated structure by a photoconductive layer and a high resistance layer.

4 Claims, 6 Drawing Sheets

LONG ARRAY PHOTOELECTRIC CONVERTING APPARATUS WITH INSULATED MATRIX WIRING

BACKGROUND OF THE INVENTION

1. Field of the Invention

The present invention relates to a photoelectric converting apparatus and, more particularly, to a photoelectric converting apparatus, in particular, a long line sensor which is used to read an image in the facsimile apparatus, image reader, digital copying apparatus, electronic blackboard, or the like.

2. Related Background Art

In recent years, the long line sensor having an equal magnification optical system has been developed in order to reduce the size of and improve the performance of the facsimile apparatus, image reader, or the like. Hitherto, this kind of line sensor is constituted in such a manner that signal processing ICs (integrated circuits) each of which is constituted by switch elements and the like are connected to each of the sensor elements arranged in a line array form. However, in the case of complying with the G>> standard of the facsimile, 1728 sensor elements are necessary for the A4 size and a number of signal processing ICs are also needed. Therefore, the number of installation steps to attach the signal processing ICs also increases and the long line sensor which can satisfy both of the manufacturing cost and the reliability is not obtained yet. On the other hand, the constitution based on the matrix connection has conventionally been used in order to reduce the number of signal processing ICs and the number of installation steps.

However, such a conventional matrix constitution has the following problems.

(1) Since very low level sensor currents are read out through the matrix connection, if the stray capacitances which are formed in the insulation crossing portions between the electrodes on the sensor side and the (common) electrodes on the matrix output side are not sufficiently reduced, signal crosstalk will be caused between the outputs of the respective sensors. This results in severe limitations in selection of an insulating material between layers and in dimensions and design of the matrix.

On the other hand, it is desirable to form the sensor unit and the matrix unit on the same substrate in order to reduce the costs and improve the reliability and the like. However, in general, the photoconductive material is formed by a low temperature process. On the contrary, a high temperature is required to form the insulating film between layers having good characteristics. Thus, it is difficult to simultaneously mixedly form the sensor unit and the matrix unit by both of the low temperature process and the high temperature process. Further, even if the matrix unit and the sensor unit are separately formed by the foregoing processes in accordance with the order of the high temperature process and the low temperature process, its manufacturing cost will increase.

(2) If a leak resistance is caused by a pin hole or the like even at one of the insulation crossing portions of the matrix unit, the signal output becomes defective and the sensors of all blocks are adversely influenced. This causes the matrix yield to remarkably deteriorate.

(3) Since the matrix common electrodes $a_1$ to $a_M$ are arranged in the longitudinal direction, the length of line sensor in the case of the width of, e.g., A4 size is set to 210 mm. Therefore, it is necessary to sufficiently reduce the leak resistance and capacitance between the respective output lines. The values of the leak resistance and capacitance between lines are concerned with the distance between the adjacent wiring patterns. The size of matrix unit cannot be so decreased.

It is an object of the present invention to eliminate the foregoing conventional drawbacks and to provide a photoelectric converting apparatus of a good yield and a low cost in which the small matrix unit can be formed on the same substrate as that of the sensor unit by the low temperature process which is almost equal to the temperature to form the sensor unit.

On the other hand, in such a conventional photoelectric converting apparatus, the matrix unit is constituted on the output line side of the transferring switch elements in order to sequentially read out the signals from one side. Thus, there is such a drawback that the signal lines as many as only the output lines of the switch elements which are turned on by a single gate line cross and a leak current flows due to the capacitances between the lines, so that very large crosstalk is caused.

It is an object of the present invention to eliminate the foregoing drawbacks and to provide a photoelectric converting apparatus in which the crossing portions of the signal lines are constituted in the portions which do not exert any influence to the transfer charges.

SUMMARY OF THE INVENTION

In a photoelectric converting apparatus according to the present invention, (N×M) photoelectric converting elements arranged in a one-dimensional array form are connected to N voltage applying electrodes and M signal readout electrodes in a matrix form, the wiring crossing portions of the matrix connection are provided on the side of the voltage applying electrodes, and the insulation in the wiring crossing portions is formed by a laminated layer constitution consisting of a photoconductive layer and a high resistance layer.

According to another aspect of the photoelectric converting apparatus according to the invention, in the photoelectric converting apparatus in which the charges accumulated in the capacitor provided for each of a plurality of photoelectric converting elements arranged in a straight line are transferred by switch elements, the matrix is formed on the drain side by use of the gate lines of the switch elements in such a manner that the signal lines do not cross.

DETAILED DESCRIPTION OF THE INVENTION

Prior Art

Figure 1:
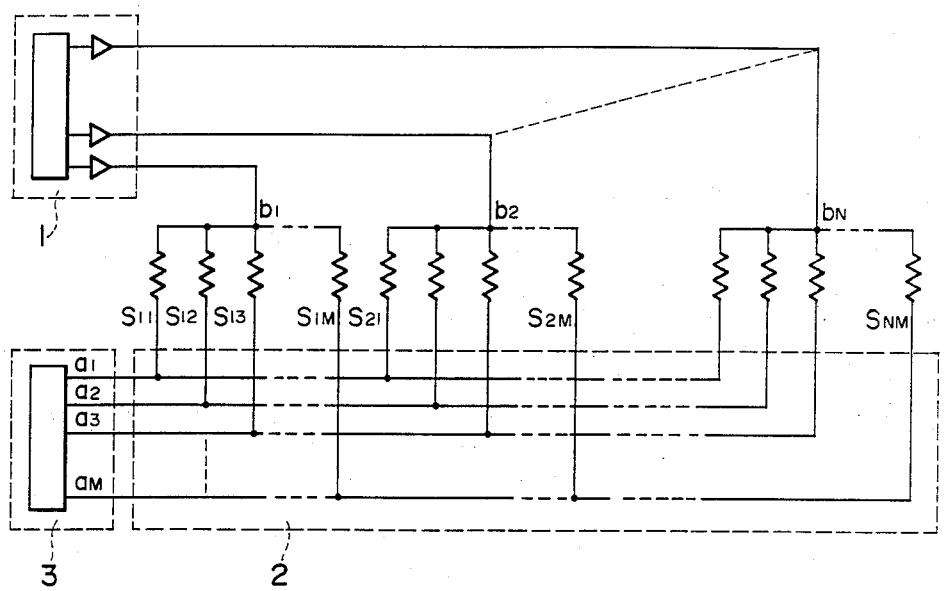
FIG. 1 is a circuit arrangement diagram of a conventional photoelectric converting apparatus having a matrix constitution.

FIG. 1 shows an example of a circuit arrangement of a conventional matrix connection. In this diagram, reference numeral 1 denotes a driver unit for applying voltages to common electrodes $b_1$ to $b_N$ of each block of sensors (sensor elements) $S_{I1}, \ldots, S_{IM}, S_{NM}$ which are divided into a plurality of blocks each consisting of M sensors. Numeral 2 denotes a matrix unit to connect the outputs of the sensors in a matrix form. Numeral 3 indicates a signal processing unit to read out the sensor output signals from M common lines $a_1$ to $a_M$ combined by the matrix connection and to process these signals.

The operation in this constitution will now be described. The driver unit 1 sequentially selects the sensor block electrodes $b_1$ to $b_N$ and applies a voltage to the selected electrodes.

Next, the photo currents of the sensors of the selected blocks are amplified by the signal processing unit 3 and output to the outside synchronously with the output timings of the driver unit 1.

With such a matrix constitution, the matrix unit can be formed over the signal processing unit 3 and the low cost photoelectric converting apparatus of a good yield can be provided. However, there are the problems of (1) to (3) as previously mentioned above.

Preferred embodiment

Figure 2:
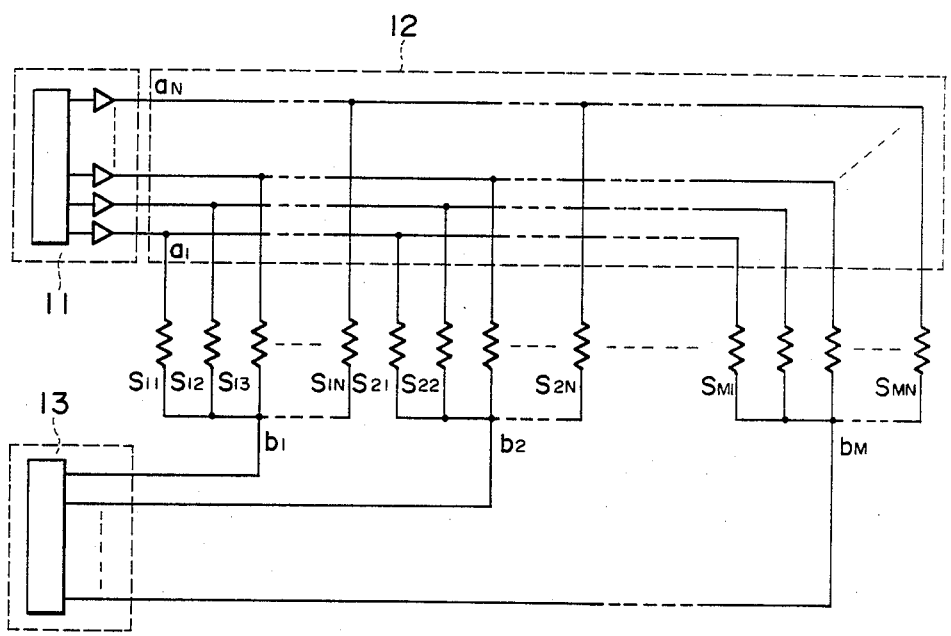
FIG. 2 is a circuit arrangement diagram of a photoelectric converting apparatus of an embodiment of the present invention.

FIG. 2 shows a circuit arrangement of an embodiment of the invention. This embodiment is the improved arrangement of the foregoing prior art arrangement of FIG. 1. In FIG. 2, reference numeral 11 denotes a driver unit to sequentially apply voltages to common electrodes $a_1$ to $a_N$ in a matrix unit (matrix connecting unit) 12. The matrix unit 12 supplies the voltages applied from the driver unit 11 to the corresponding sensors of the respective blocks, respectively. Numeral 13 indicates a signal processing unit to amplify the signals which are output from common electrodes $b_1$ to $b_M$ of each sensor block and to process these output signals.

Figure 5:
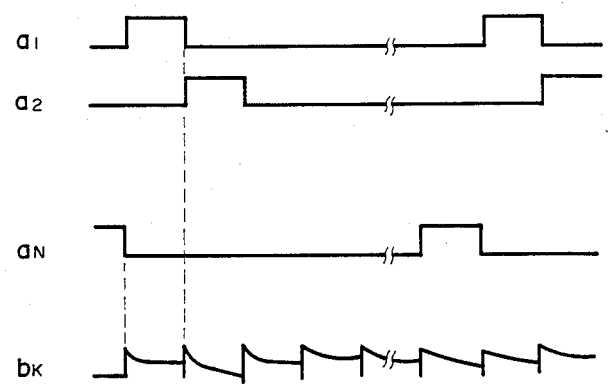
FIG. 5 is a timing chart showing the operation of the apparatus of FIG. 2.

The operation will now be described. The common electrodes $a_1, \ldots, a_I, \ldots, a_N$ of the matrix unit 12 are selected one by one by the driver unit 11. When the common electrode $a_I$ is selected, the drive voltages are applied to the M sensors $S_{1I}$ to $S_{MI}$. The sensor outputs in each block are sequentially read out from the common electrodes $b_1$ to $b_M$ every block synchronously with the drive voltages. FIG. 5 shows readout timings in this case.

Figure 3:
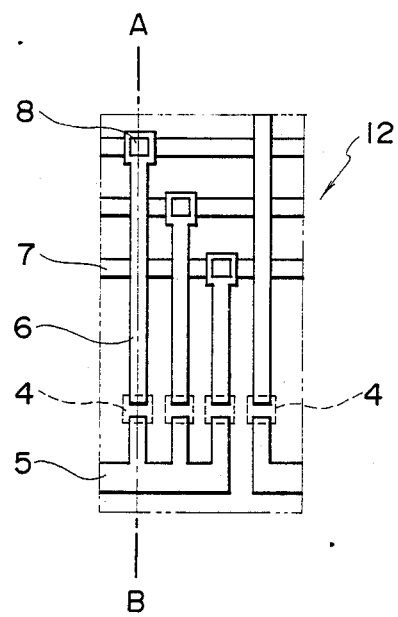
FIG. 3 is a plan view showing a constitution of the photoelectric converting apparatus of FIG. 1.
Figure 4:
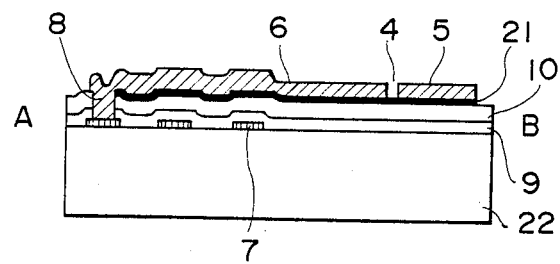
FIG. 4 is a cross sectional view taken along the line A-B in FIG. 3.

FIG. 3 shows a constitution of a part of the embodiment of the matrix unit 12 in FIG. 2. FIG. 4 shows a cross sectional view taken along the line A-B in FIG. 3. In FIGS. 3 and 4, reference numeral 4 denotes a sensor photo sensing unit; 5 is a sensor block common electrode; 6 an individual electrode of the matrix unit 12; 7 a common electrode of the matrix unit 12; and 8 a through hole to connect the individual electrode 6 of the matrix unit 12 with the common electrode 7.

In FIG. 4, numeral 9 represents a high resistance layer; 10 a photoconductive layer; 21 a junction layer to ohmic connect the photoconductive layer 10 with the sensor block common electrode 5 or with the individual electrode 6; and 22 a substrate.

In this embodiment, the photoconductivity type (ohmic type) sensor having the opposite electrodes 5 and 6 on the same plane is used as the sensor element (sensor photo sensing unit) 4. However, the invention is not limited to this type but the other type such as sandwich type, p-i-n type, Schottky type, or the like can be also applied.

On the other hand, in the embodiment, amorphous silicon hydride (a-Si:H) by a glow discharge method is used as the photoconductive material (photoconductive layer) 10. However, CdS, CdSe, a-Ge:H, ZnSe, or the like can be also used as the photoconductive material.

Further, as the material of the high resistance layer 9 laminated on the substrate 22, it is possible to use a silicon nitride film (SiN:H) by the glow discharge method, $SiO_2$ by a sputtering method, high resistance a-Si:H by a high power film forming method, or the like. Glass is used as the material of the substrate 22. For example, 7059 glass, quartz glass, or the like may be used. If the sensor photo sensing surface is the sensor forming surface, an opaque substrate material such as, e.g., ceramics or the like can be also used.

As described above, according to this embodiment, the matrix connecting unit is arranged on the drive electrode side, so that the following effects are obtained.

(1) The common electrodes $a_1$ to $a_N$ of the matrix unit 12 are driven by low impedances by the driver unit 11. Therefore, the crosstalks of the signals, deterioration of the quality, and the like due to the capacitances between lines and leak resistances of the common electrodes $a_1$ to $a_N$, and due to the stray capacitances and leak resistances in the insulation crossing portions of the matrix unit 12 never occur.

(2) Since the insulation property which is required as the insulating film between layers of the matrix unit 12 is lightened, it is sufficient to have the resistance factor which is nearly equal to that of the photoconductive film and the withstanding voltage enough to withstand the drive voltage. Therefore, the photoelectric converting apparatus of the invention can be realized even if the manufacturing processes are limited to the low temperature process. The degree of freedom in selection of the material is large. Further, by using the same film forming process as that of the sensor unit for the matrix unit 12, the low cost and long line sensor of a good yield can be provided as the photoelectric converting apparatus.

Prior art

Figure 6:
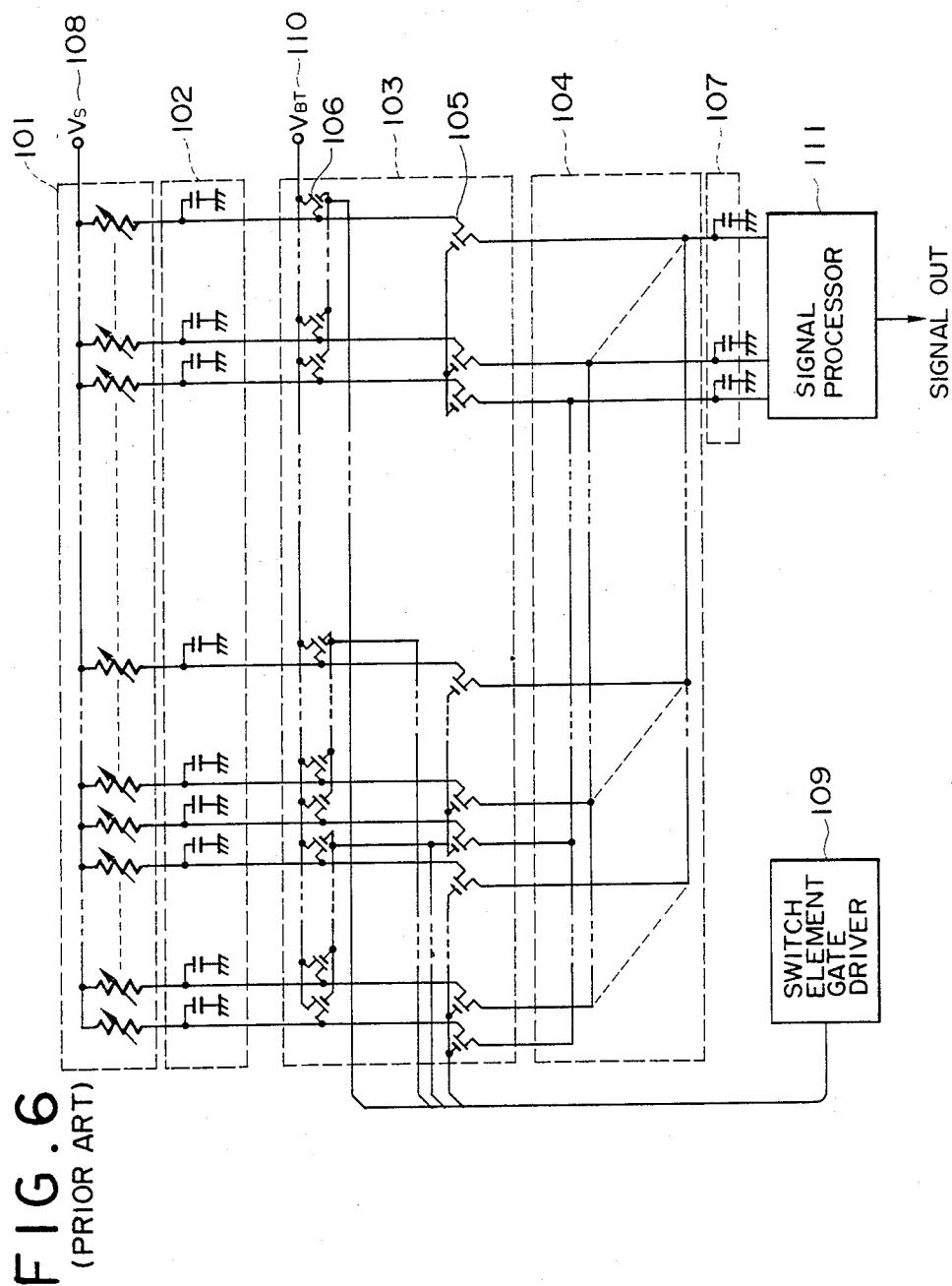
FIG. 6 is a circuit diagram showing a constitution of a conventional photoelectric converting apparatus in which a matrix is formed on the source line side.

FIG. 6 shows a constitution of another conventional photoelectric converting apparatus. For example, a matrix unit 104 is formed on the output line side of transfer switch elements 105 in order to sequentially read out the signals from one side. In FIG. 6, reference numeral 101 denotes a photoelectric converting element unit; 102 is a capacitor unit to accumulate the charges to be transferred; 103 a switch element unit; 106 a resetting switch element; 107 a capacitor unit to accumulate the charges transferred; 108 a voltage which is applied to the circuit; 109 a gate driver of the switch elements 105 and 106; 110 a reset bias of the resetting switch element 106; and 111 a signal processor.

In the conventional photoelectric converting apparatus in FIG. 6, there are such drawbacks that the signal lines as many as only the output lines of the switch elements 105 which are turned on by one gate line cross and the leak currents flow due to the capacitances between the lines, so that very large crosstalks occur.

Preferred embodiment

Figure 7:
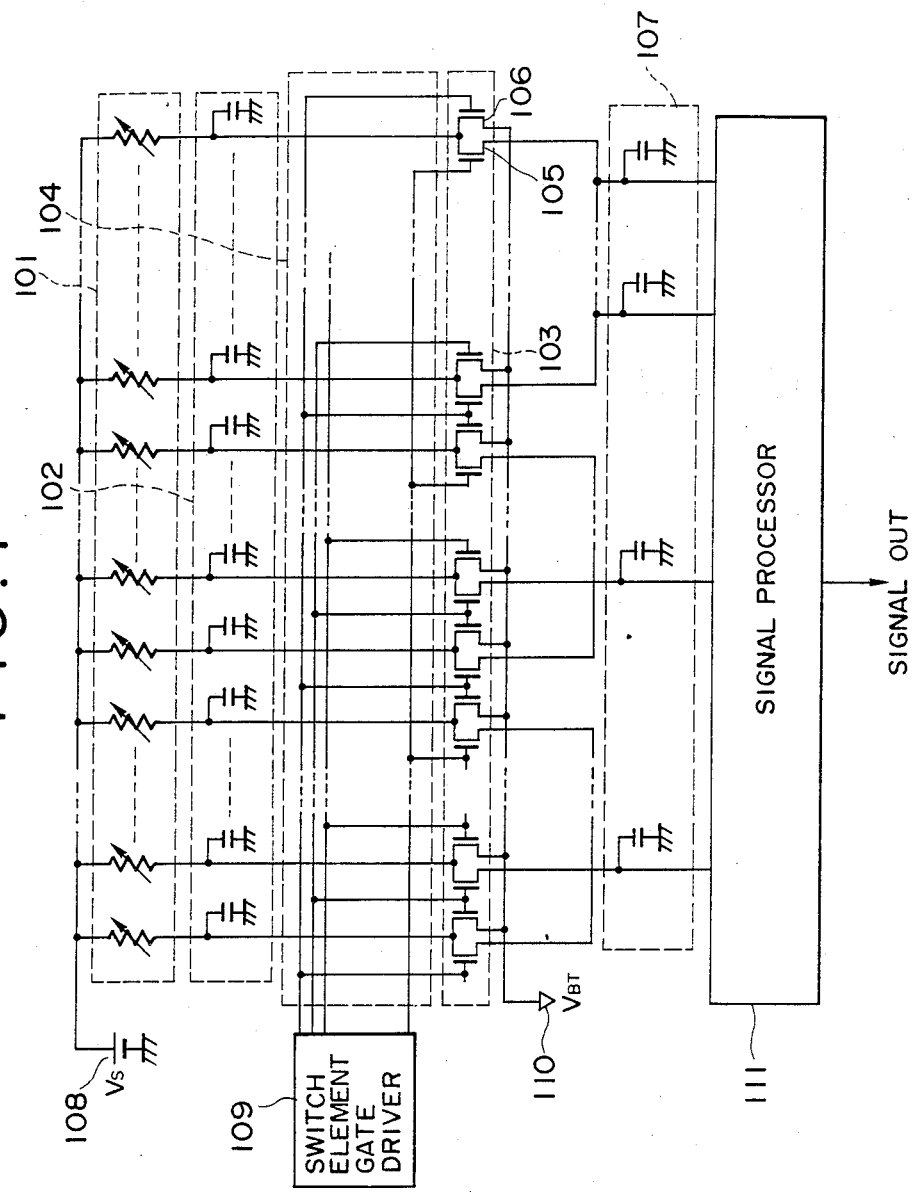
FIG. 7 is a circuit diagram showing a constitution of a photoelectric converting apparatus of an embodiment of the invention in which a matrix is formed on the drain side.

FIG. 7 shows an embodiment of a circuit arrangement of the improved photoelectric converting apparatus according to the invention with respect to the conventional apparatus in FIG. 6.

In this embodiment, a photoconductivity type element is used as the photoelectric converting element unit 101. The capacitor unit 102 accumulates the charges from the photoelectric converting element unit 101. A TFT (thin film transistor) is used as the switch element unit 103 in the embodiment. The matrix unit 104 functions to allow the gate of the switch element unit 103 to perform the switching operation. When the number of gate lines assume m, the switch element unit 103 is divided into n blocks each consisting of m switch elements. Each block is constituted by the first bit, second bit, ..., and mth bit. The bits of the same number are connected by the common gate line.

The transfer switch element 105 transfers the charges accumulated in the capacitor unit 102. After the charges were transferred by the transfer switch element 105, the resetting switch element 106 refreshes the capacitor unit 102. The capacitor unit 107 accumulates the charges transferred by the switch element 106. Also a voltage 108 to be applied to the circuit, a gate driver 109 of the switch elements 105 and 106, a reset bias 110 in the resetting switch element 106, and a signal process 111 for outputting the charges transferred to the capacitor unit 107 to the outside are provided. In this embodiment, the matrix unit 104 is connected on the drain side between the capacitor unit 102 and the switch element unit 103. The switch element gate driver 109 is connected to the matrix unit 104.

With the foregoing constitution, the charges are accumulated in each capacitor of the capacitor unit 102 on the basis of the output from the photoelectric converting element unit 101 driven by the applied voltage 108. Next, the gates of the switch element unit 103 are turned on one by one by the gate driver 109, thereby transferring the charges in the capacitor unit 102 by the transfer switch element 105. When the next gate is turned on, the resetting switch element 106 is turned on, thereby refreshing the capacitor unit 102 at the front stage. The charges transferred by the transfer switch element 105 are accumulated into the capacitor unit 107 at the post stage. These charges are rearranged by the signal processor 111 and output to the outside as the serial signal.

Figure 8:
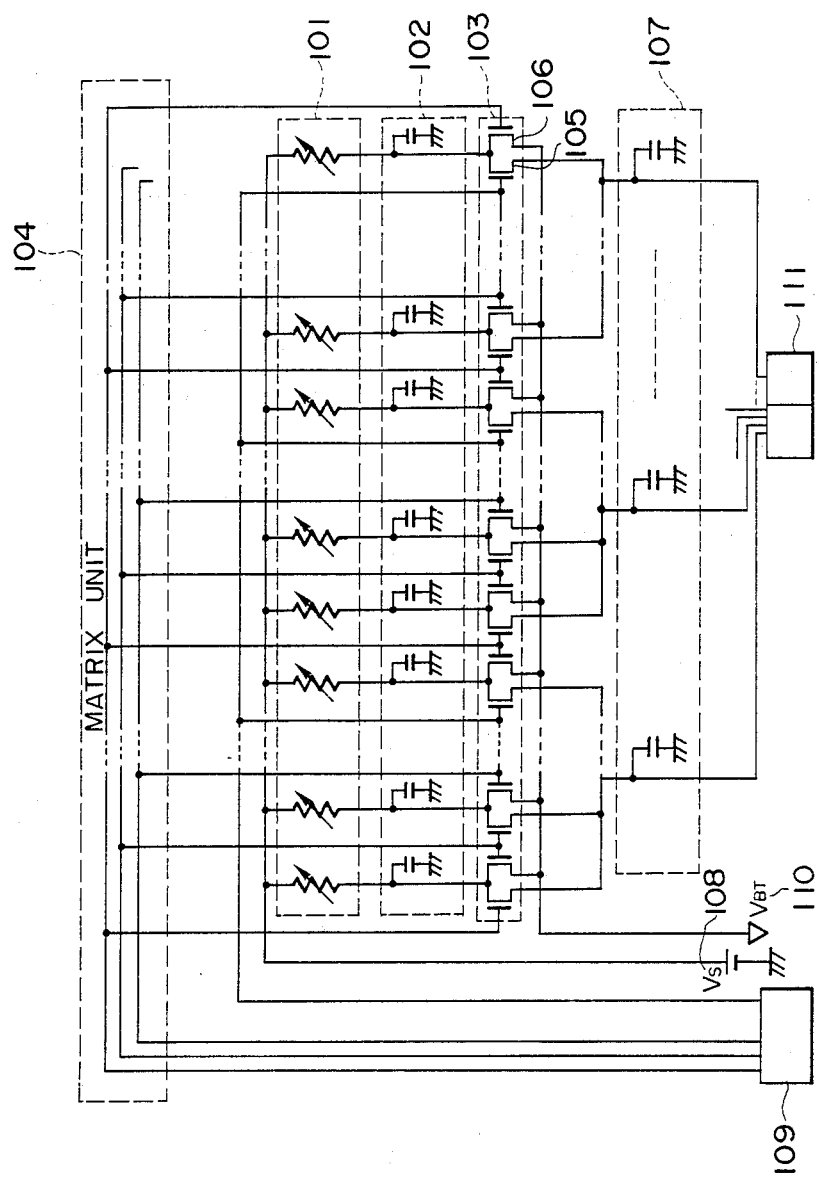
FIG. 8 is a circuit showing a constitution of another embodiment of the invention in which a matrix unit is overlying signal lines through which the signals to be transferred flow.

FIG. 8 shows a constitution of another embodiment as the partially modified form of the embodiment shown in FIG. 7.

In this embodiment, the gate drive matrix unit 104 of the switch element unit 103 is arranged in the further upper portion than the photoelectric converting element unit 101 so as not to cross the signal lines from the capacitor unit 102. Thus, there is such an effect that the crosstalks are further reduced than the embodiment of FIG. 7.

There is also another embodiment using a MOS FET (field effect transistor) as the switch element unit 103. There is still another embodiment using a photodiode of the pin or Schottky type as the photoelectric converting element unit 101. There is further another embodiment in which photodiode is used as the photoelectric converting element unit 101 and the charges are accumulated by the capacitance of the photodiode itself and the capacitor unit 102 is removed.

As described above, according to the invention, the transfer switch elements are classified into a plurality of blocks each consisting of the switch elements as many as the number of gate lines. The same gate lines are sequentially arranged from the head of each block. Therefore, the matrix unit can be formed on the drain side of the switch element unit and it is possible to obtain such effects that the crosstalk in the source lines is eliminated and the change in signal by the transfer can be reduced.

What we claim is:

1. A photoelectric converting apparatus having an (N×M) plurality of photoelectric converting elements arranged in a one-dimensional array form, said elements being connected to N voltage applying electrodes and M signal readout electrodes in a matrix form which includes insulated wiring crossing portions, wherein
   the wiring crossing portions of said matrix connectin are provided on the side of said voltage applying electrodes, and
   the insulation of said wiring crossing portion is formed as a laminated structure by a photoconductive layer and a high resistance layer, both of said layers being formed by a low temperature process.

2. The apparatus according to claim 1, wherein said low temperature process is a glow discharge method.

3. The apparatus according to claim 1, wherein said photoconductive layer is amorphous.

4. The apparatus according to claim 1, wherein said photoconductive layer and said high resistance layer are formed on a glass substrate.

* * * * *

UNITED STATES PATENT AND TRADEMARK OFFICE
CERTIFICATE OF CORRECTION

PATENT NO. : 4,788,445

DATED : November 29, 1988

INVENTOR(S) : KATSUNORI HATANAKA, ET AL.    Page 1 of 2

It is certified that error appears in the above-identified patent and that said Letters Patent is hereby corrected as shown below:

Title page:

IN [56] REFERENCES CITED

"Fitzpatrick, Cella Harper & Scinto" should read --Fitzpatrick, Cella, Harper & Scinto--.

COLUMN 2

Line 61, "cross sectional" should read --cross-sectional--.

COLUMN 3

Line 64, "cross sectional" should read --cross-sectional--.

COLUMN 4

Line 36, "crosstalks" should read --crosstalk--.

COLUMN 5

Line 8, "crosstalks occur." should read --crosstalk occurs.--.
Line 23, "assume m," should read --assumes m,--.
Line 36, "signal process 111" should read --signal processor 111--.

UNITED STATES PATENT AND TRADEMARK OFFICE
CERTIFICATE OF CORRECTION

PATENT NO. : 4,788,445
DATED : November 29, 1988
INVENTOR(S) : KATSUNORI HATANAKA, ET AL.   Page 2 of 2

It is certified that error appears in the above-identified patent and that said Letters Patent is hereby corrected as shown below:

COLUMN 6

Line 11, "crosstalks are" should read --crosstalk is--.
Line 40, "connectin" should read --connection--.

Signed and Sealed this

Seventeenth Day of October, 1989

Attest:

DONALD J. QUIGG

Attesting Officer    Commissioner of Patents and Trademarks